(12) United States Patent
Nikoonahad

(10) Patent No.: US 7,656,529 B1
(45) Date of Patent: Feb. 2, 2010

(54) OVERLAY ERROR MEASUREMENT USING FOURIER OPTICS

(76) Inventor: Mehrdad Nikoonahad, 271 Oakhurst Pl., Menlo Park, CA (US) 94025

(*) Notice: Subject to any disclaimer, the term of this patent is extended or adjusted under 35 U.S.C. 154(b) by 458 days.

(21) Appl. No.: 11/754,801

(22) Filed: May 29, 2007

Related U.S. Application Data

(60) Provisional application No. 60/809,650, filed on May 30, 2006, provisional application No. 60/811,051, filed on Jun. 5, 2006.

(51) Int. Cl.
  *G01B 11/00* (2006.01)
(52) U.S. Cl. .................. 356/401; 356/622; 356/620; 356/400
(58) Field of Classification Search ......... 356/399–401, 356/614–622
  See application file for complete search history.

(56) References Cited

U.S. PATENT DOCUMENTS

| | | | |
|---|---|---|---|
| 4,710,026 A | 12/1987 | Magome et al. | |
| 5,171,999 A | 12/1992 | Komatsu et al. | |
| 5,204,535 A * | 4/1993 | Mizutani | 250/548 |
| 5,216,257 A | 6/1993 | Brueck et al. | |
| 5,333,050 A | 7/1994 | Nose et al. | |
| 5,689,339 A | 11/1997 | Ota et al. | |
| 5,712,707 A | 1/1998 | Ausschnitt et al. | |
| 5,923,041 A | 7/1999 | Cresswell et al. | |
| 6,023,338 A | 2/2000 | Bareket | |
| 6,710,876 B1 | 3/2004 | Nikoonahad et al. | |
| 6,768,543 B1 | 7/2004 | Aiyer | |
| 6,897,957 B2 | 5/2005 | Meeks | |
| 6,958,819 B1 * | 10/2005 | Heaton et al. | 356/616 |
| 6,970,255 B1 * | 11/2005 | Spady et al. | 356/616 |
| 6,985,618 B2 | 1/2006 | Adel et al. | |
| 7,009,704 B1 | 3/2006 | Nikoonahad et al. | |
| 7,061,615 B1 | 6/2006 | Lowe-Webb | |
| 7,095,499 B2 * | 8/2006 | Monshouwer et al. | 356/401 |
| 7,181,057 B2 | 2/2007 | Adel et al. | |
| 7,230,703 B2 * | 6/2007 | Sezginer et al. | 356/401 |
| 7,239,213 B2 * | 7/2007 | Dreps et al. | 333/1 |
| 2002/0192577 A1 | 12/2002 | Fay et al. | |
| 2004/0002172 A1 * | 1/2004 | Goo | 438/7 |
| 2004/0239934 A1 | 12/2004 | Bowes | |
| 2004/0257571 A1 | 12/2004 | Mieher et al. | |
| 2005/0046855 A1 | 3/2005 | Davidson | |
| 2005/0094153 A1 * | 5/2005 | Nikoonahad et al. | 356/492 |
| 2005/0195398 A1 * | 9/2005 | Adel et al. | 356/401 |
| 2007/0064247 A1 * | 3/2007 | Petit et al. | 356/625 |
| 2007/0091325 A1 | 4/2007 | Nikoonahad | |
| 2008/0002213 A1 * | 1/2008 | Weiss | 356/620 |
| 2008/0043212 A1 * | 2/2008 | Shibazaki | 355/53 |

* cited by examiner

*Primary Examiner*—L. G Lauchman
(74) *Attorney, Agent, or Firm*—Fernandez & Associates, LLP

(57) ABSTRACT

The present invention discloses an overlay alignment measurement apparatus and method. The overlay target is periodic and is illuminated by coherent radiation; a Fourier transform lens optically computes the Fourier transform of the target. Analysis of the spatial frequencies at the Fourier plane yields overlay alignment information.

33 Claims, 15 Drawing Sheets

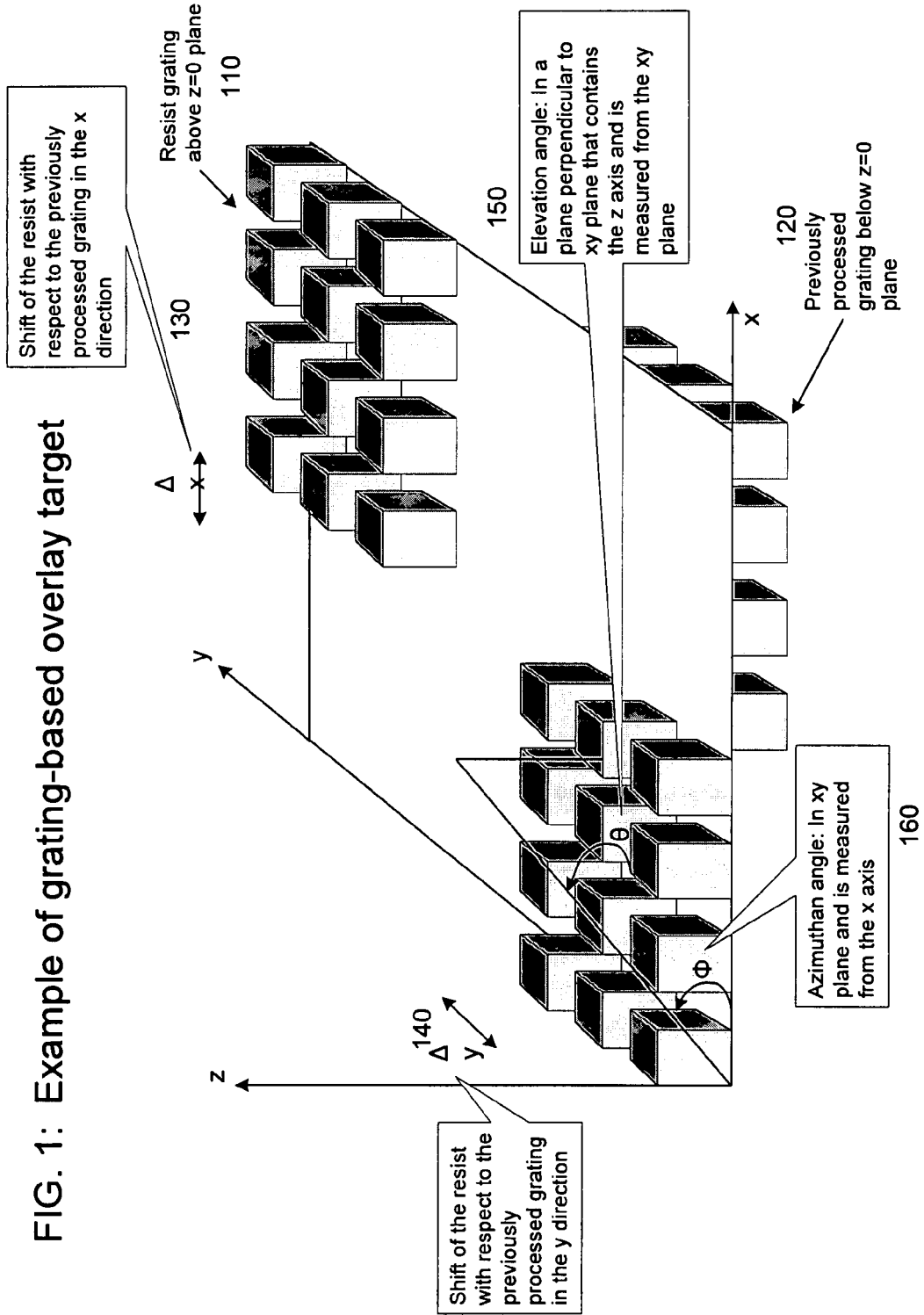
FIG. 1: Example of grating-based overlay target

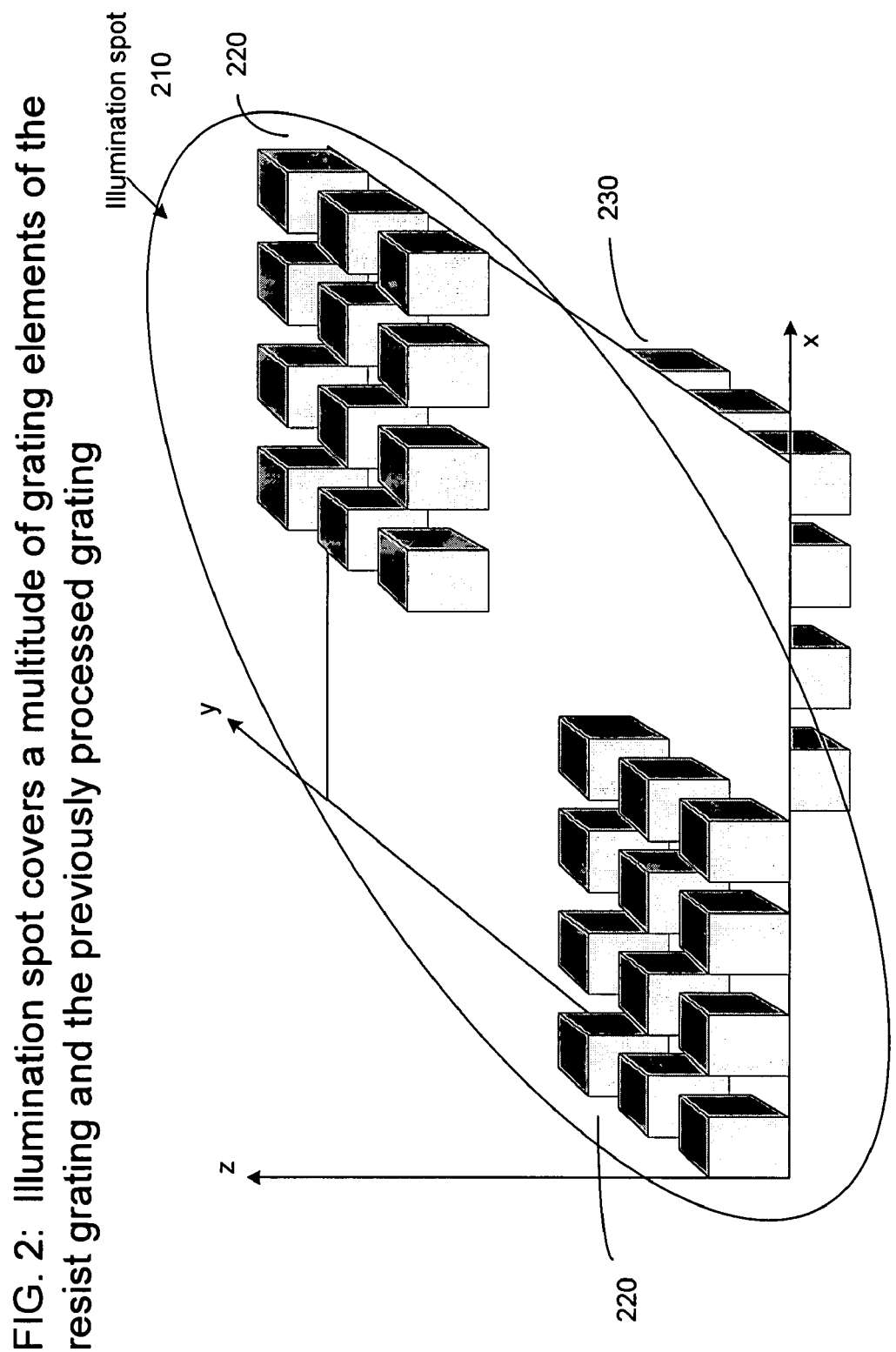
FIG. 2: Illumination spot covers a multitude of grating elements of the resist grating and the previously processed grating

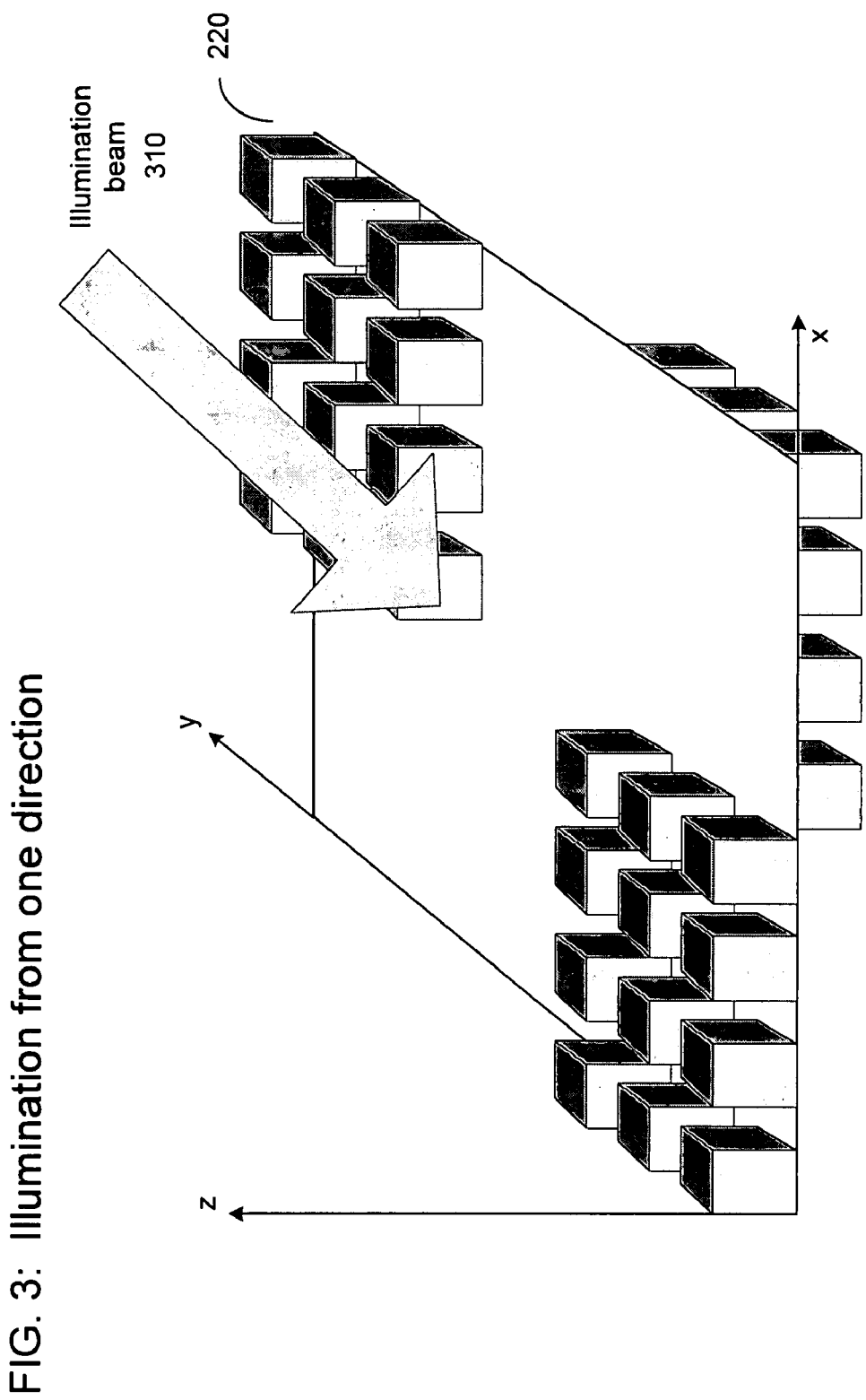
FIG. 3: Illumination from one direction

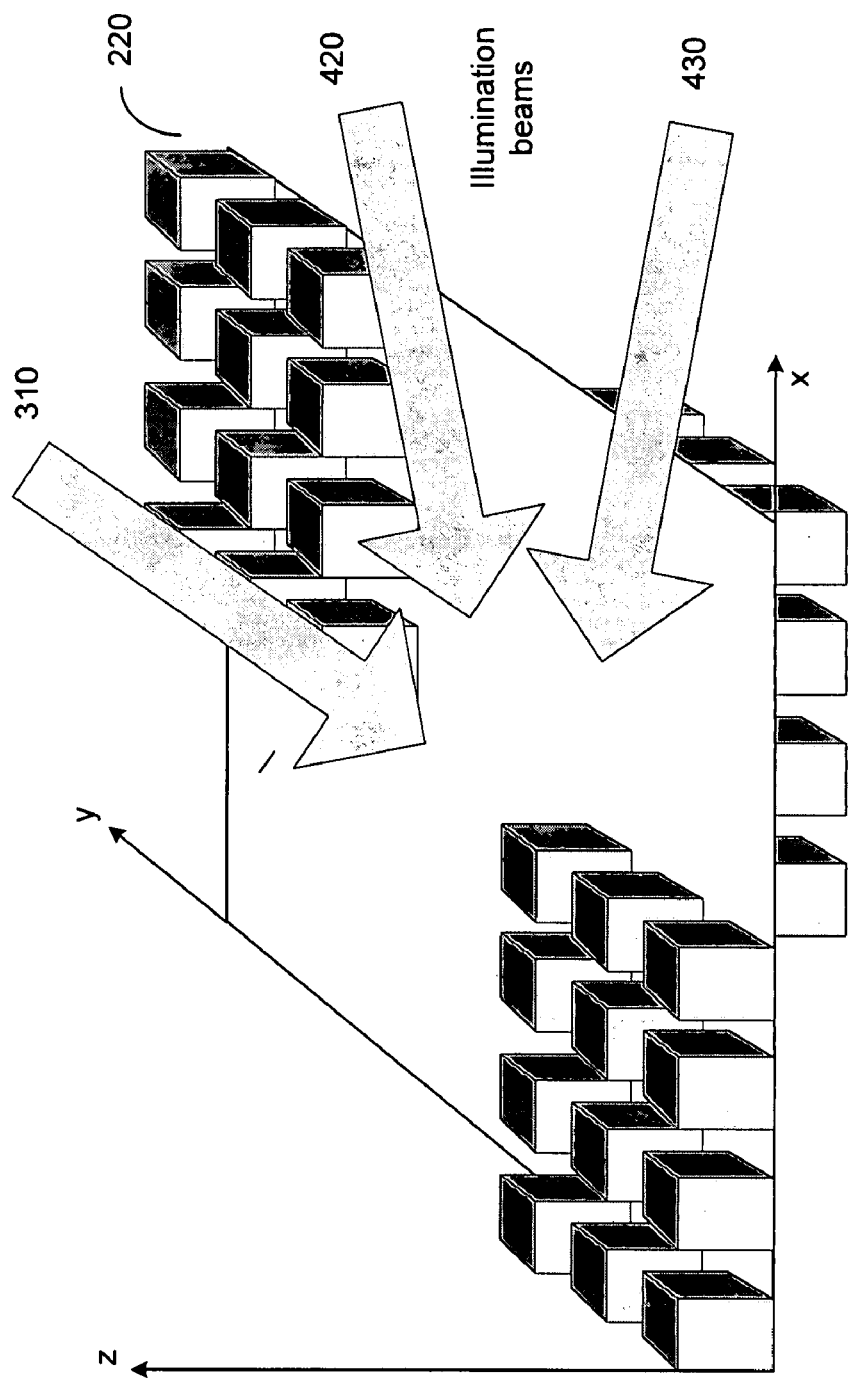
FIG. 4: Illumination from multiple elevation angles

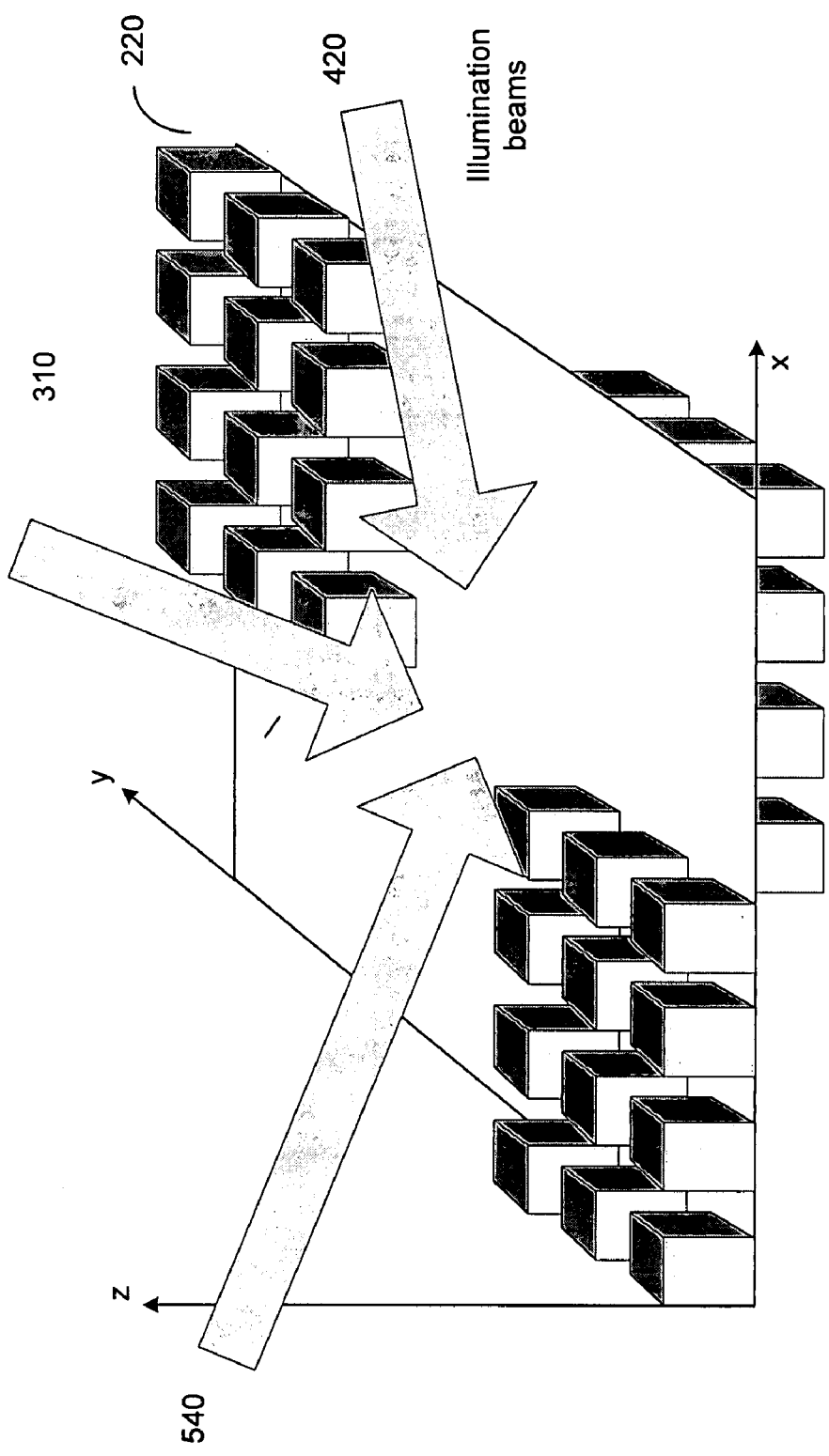
FIG. 5: Illumination from multiple azimuthal angles

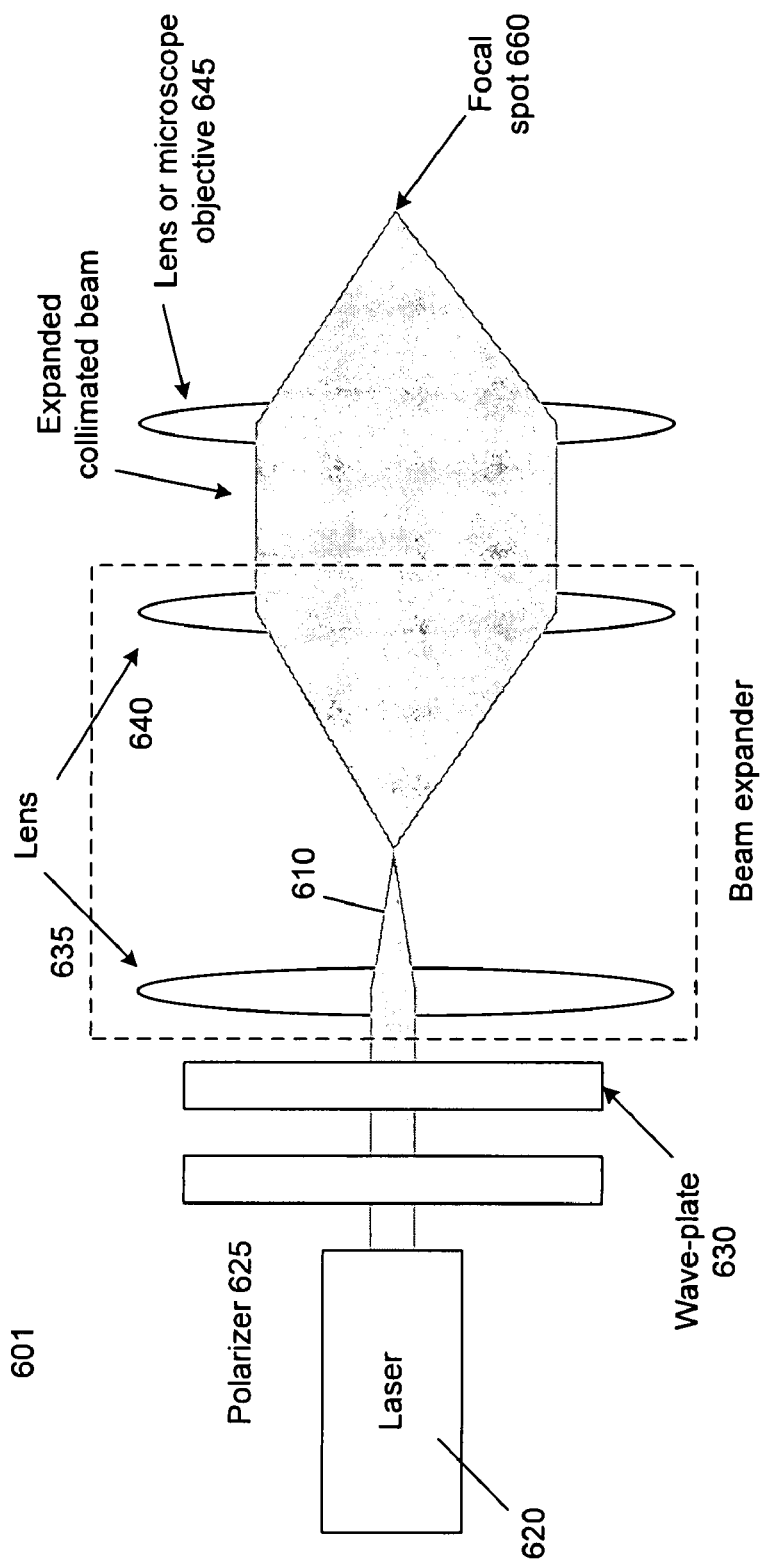
FIG. 6: Example of an illumination optics

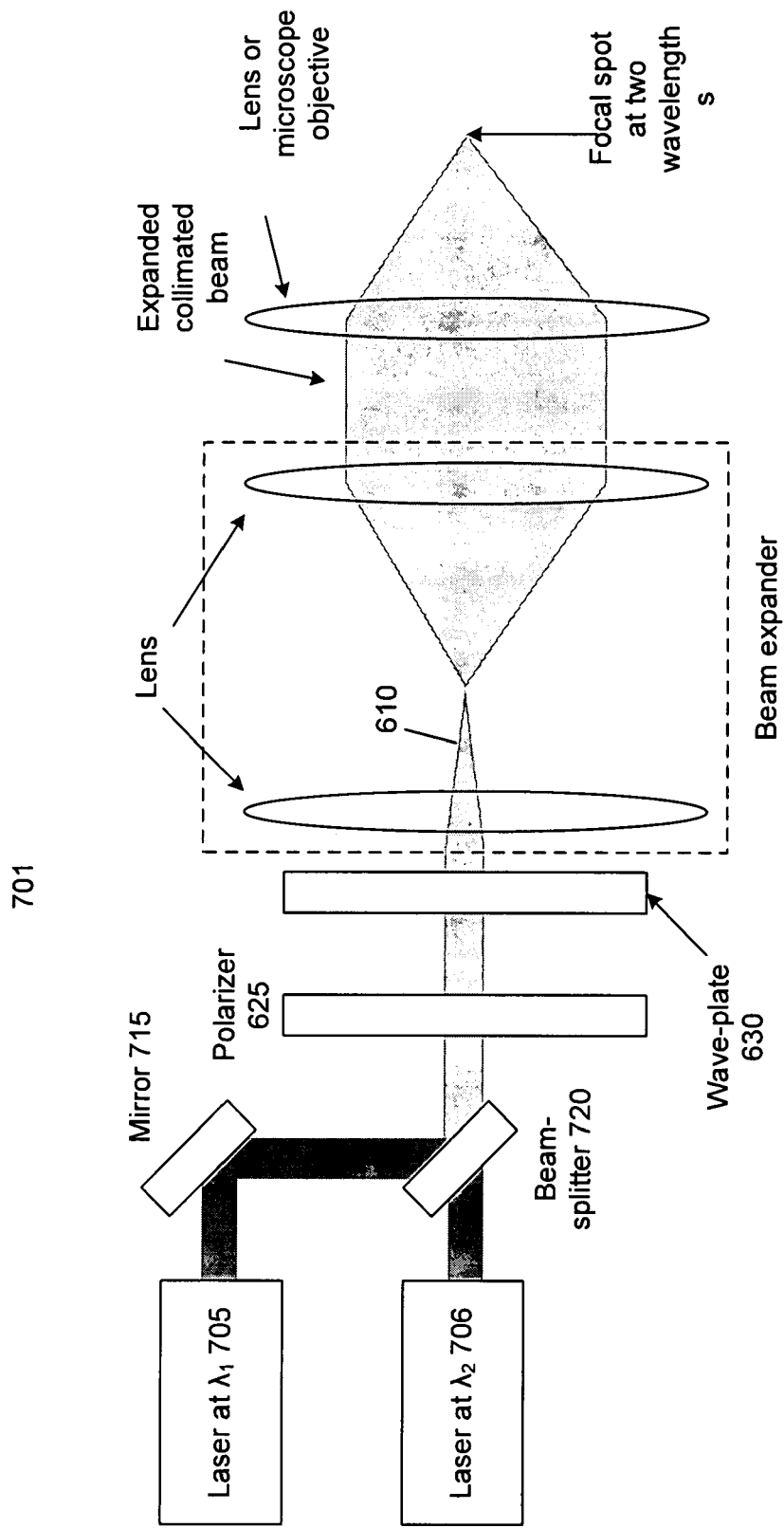
FIG. 7: Example of an illumination optics

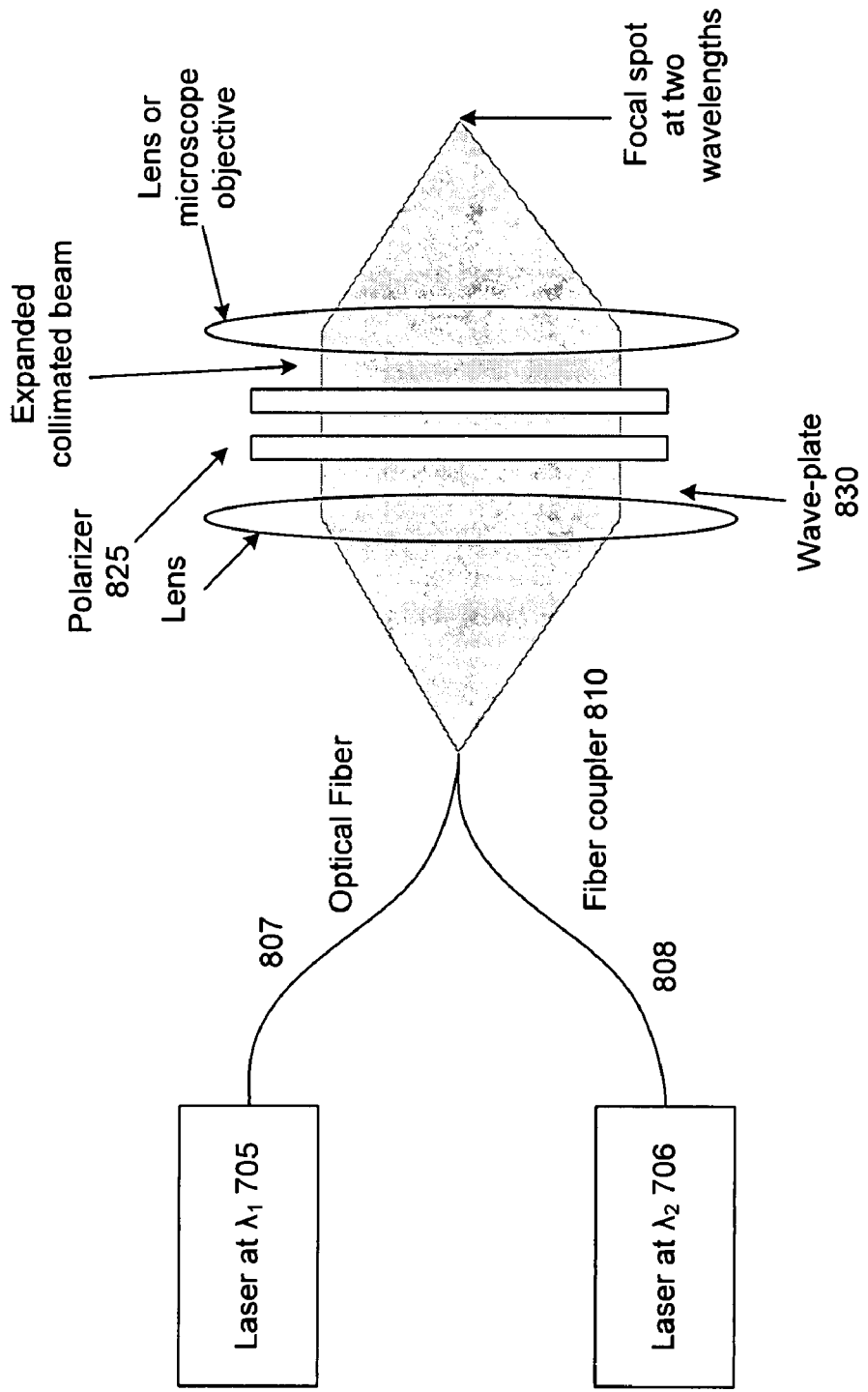
FIG. 8: Multiple wavelength illumination optics

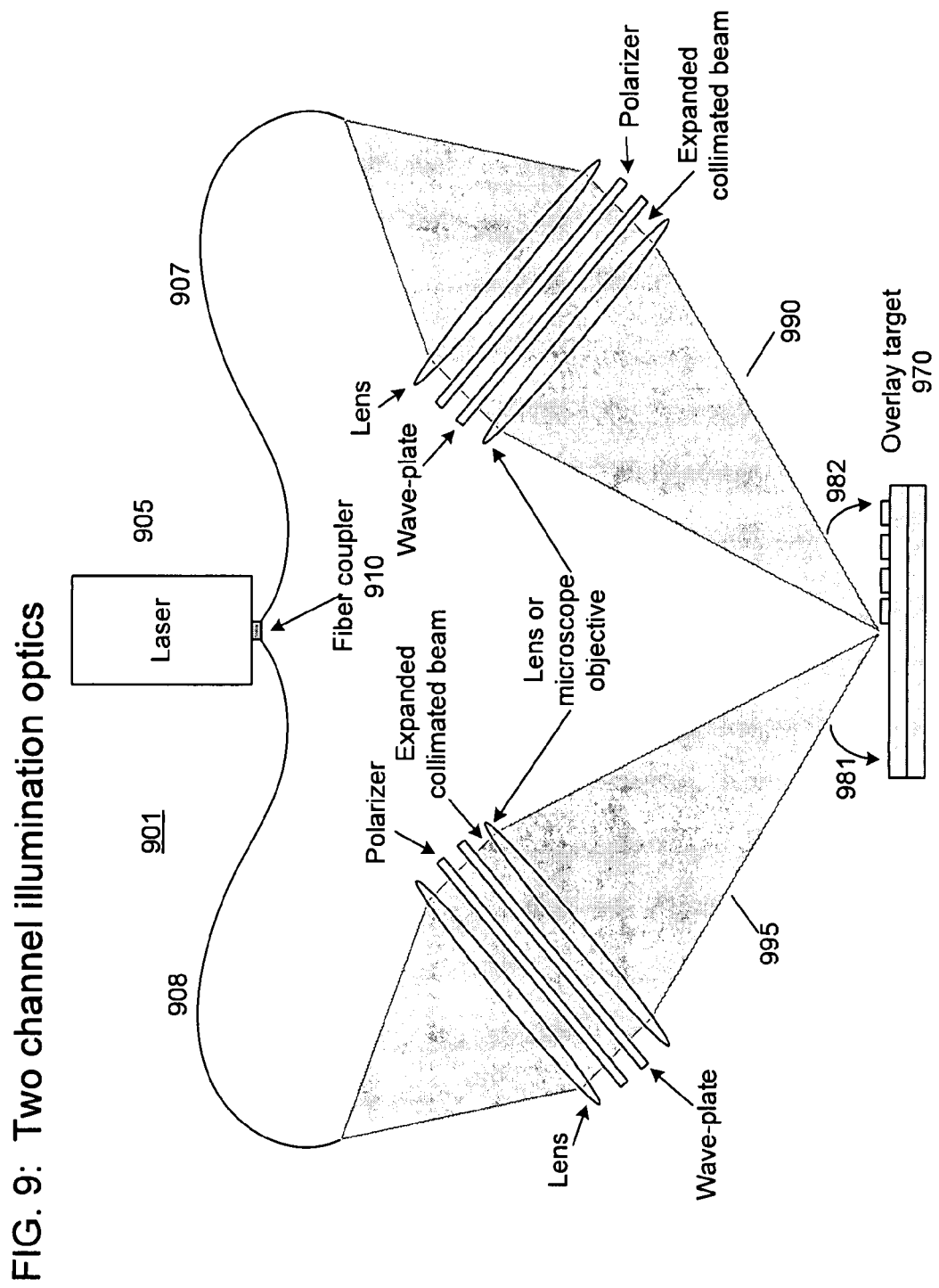
FIG. 9: Two channel illumination optics

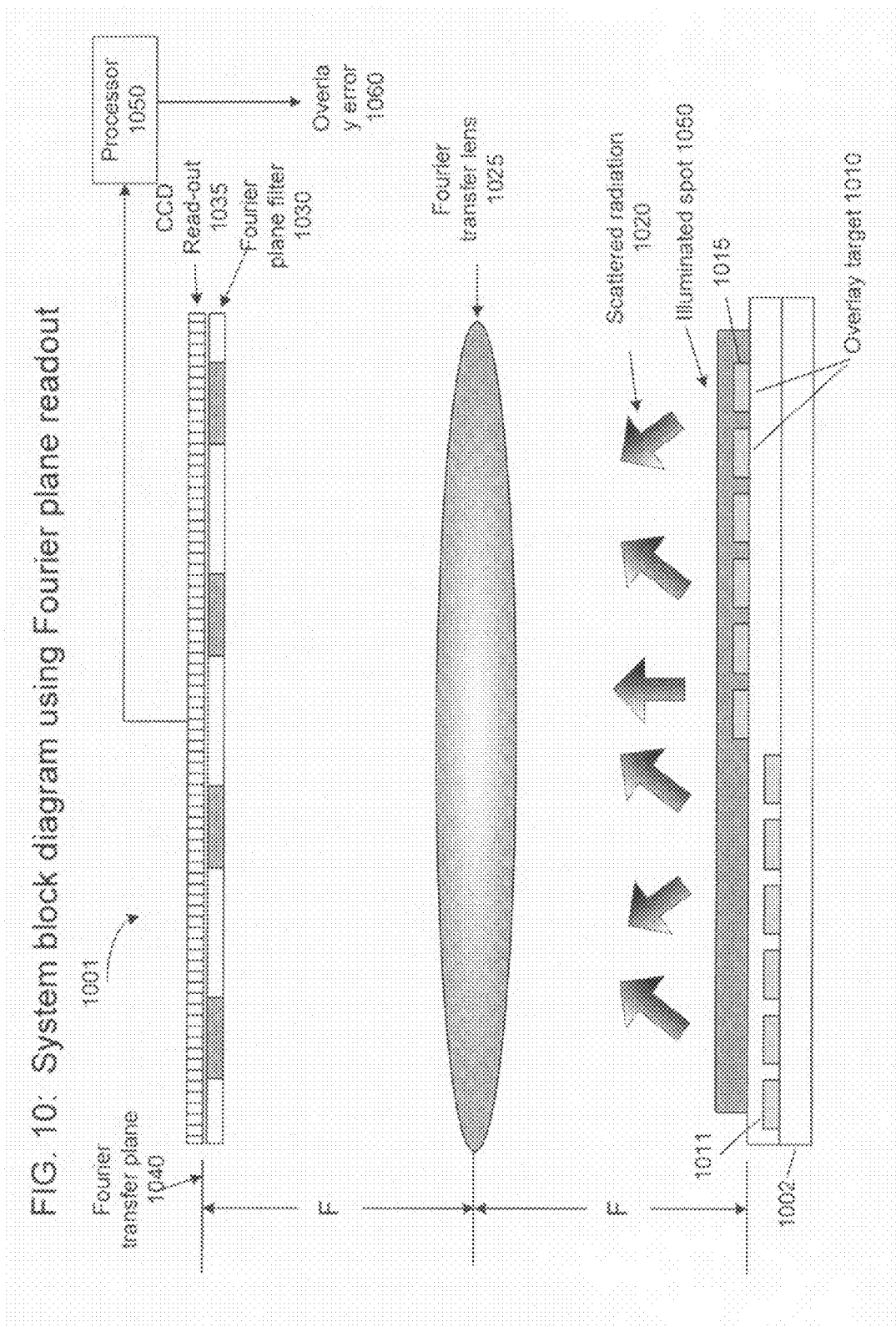

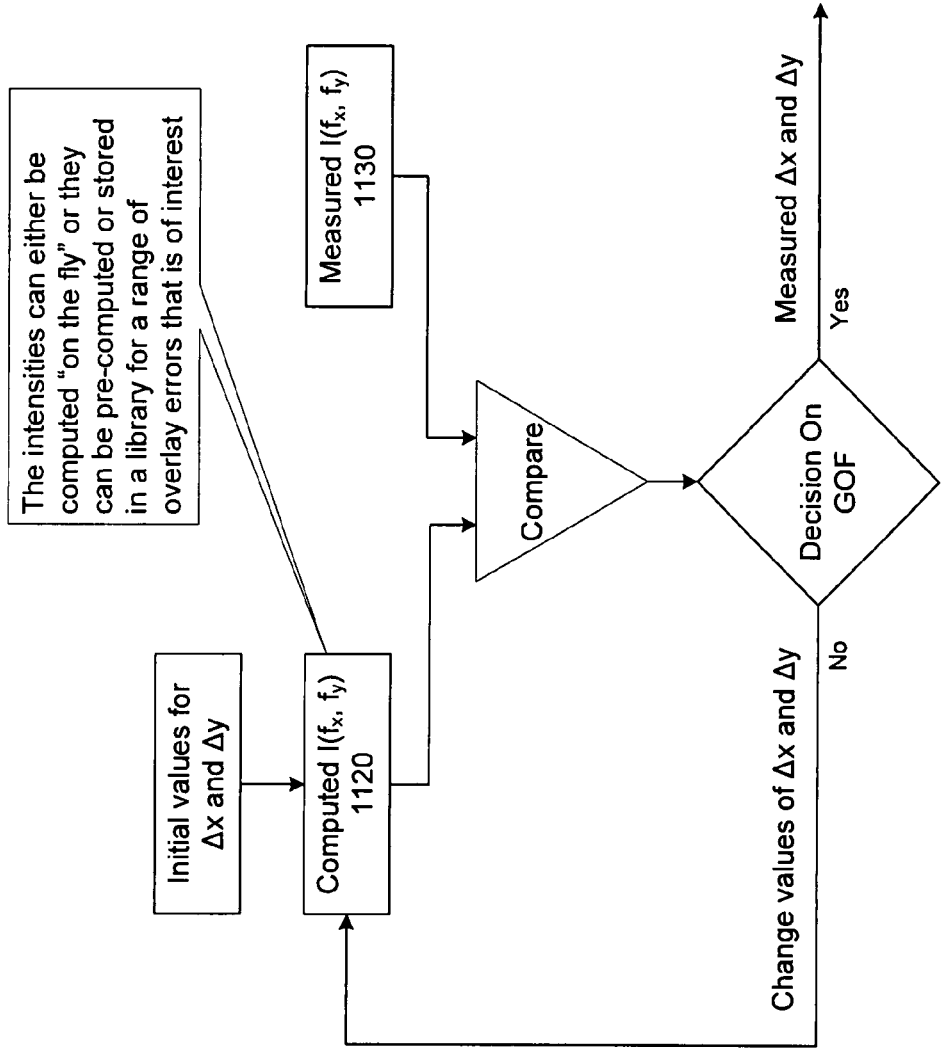
FIG. 11: Two dimensional surface fitting algorithm for computer overlay errors

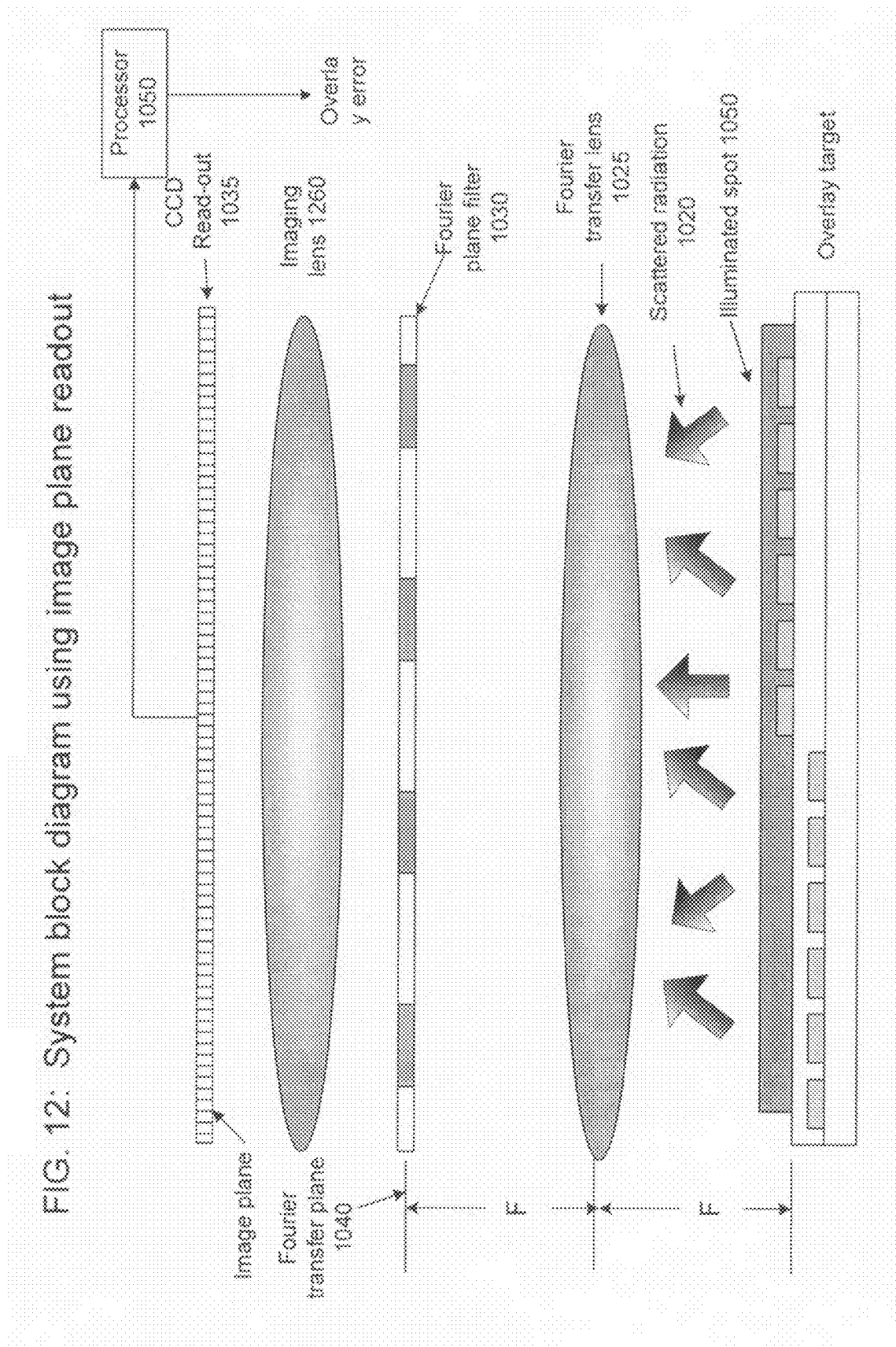
FIG. 12: System block diagram using image plane readout

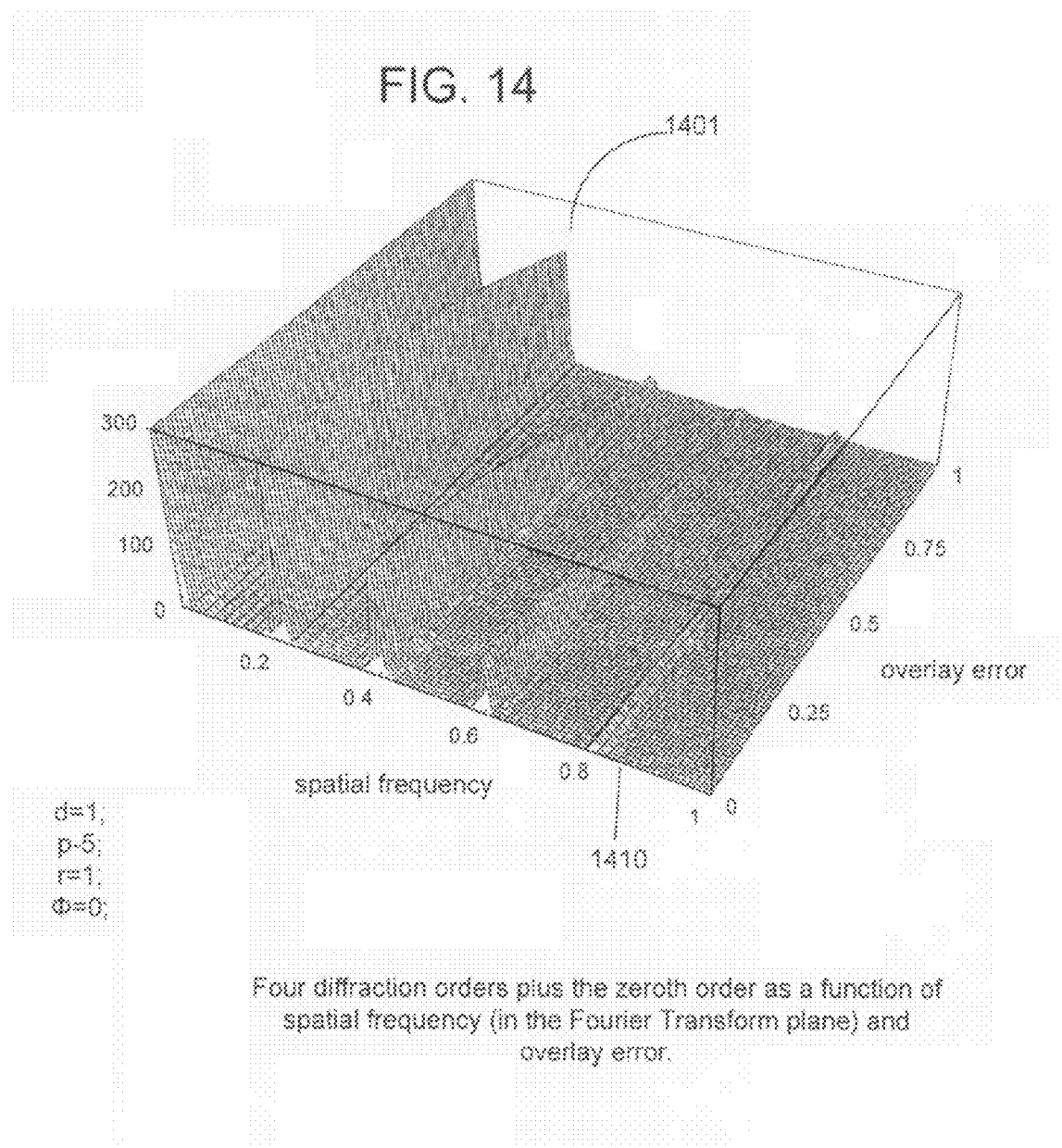
Four diffraction orders plus the zeroth order as a function of spatial frequency (in the Fourier Transform plane) and overlay error.

d=1;
p-5;
r=1;
Φ=0;

Four diffraction orders as a function of spatial frequency and overlay error plotted ona more sensitive scale.

OVERLAY ERROR MEASUREMENT USING FOURIER OPTICS

CROSS-REFERENCE TO RELATED APPLICATIONS

This application claims the benefit of U.S. provisional application Ser. No. 60/809,650 filed on May 30, 2006 and U.S. provisional application Ser. No. 60/811,051 filed on Jun. 5, 2006 which are incorporated fully herein by reference. Additionally, the following are incorporated fully herein by reference, U.S. Pat. No. 6,985,618, U.S. Pat. No. 6,897,957, U.S. Pat. No. 6,023,338, U.S. Pat. No. 6,710,876, U.S. Pat. No. 7,009,704, U.S. Pat. No. 6,867,862, U.S. Pat. No. 6,768,543, and US patent application number 2007/0091325.

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC

Not Applicable

BACKGROUND OF THE INVENTION

1. Field of the Invention

This invention relates to a method and apparatus for overlay alignment measurement during various stages of integrated circuit processing for microelectronic fabrication.

2. Description of Related Art Including Information Disclosed Under 37 CFR 1.97 and 1.98

Planar technology that is conventionally used in high volume production of integrated circuits used in computers, communication equipment, cellular phones and other consumer electronic devices, relies on successive processing of materials deposited in the form of thin films on top of silicon or other substrates. If two successive layers are misaligned with respect to each other, the device performance degrades and it may fail. For example, without any limitations, a misalignment can lead to an increase in the resistance of via's and contacts and hence an increase in the RC time delay of the circuit, leading to a reduction in the operable speed of the device. It is of great interest to measure the alignment accuracy of one layer's placement or registration with respect to a preceding layer's position with high precision and repeatability and with good matching between metrology tools. "Perfect alignment" rarely happens; every integrated circuit design allows for some misalignment between two succeeding layers; it is of great importance to know how well two layers are aligned with regard to each other and to know whether or not the "misalignment" is outside a prescribed tolerance band. Overlay error is the mis-registration in placement of a layer above a previously processed layer. As used herein "overlay error" or "alignment error" is defined as the deviation from perfect alignment in the x and the y direction as noted by $\Delta x$ or $\Delta y$; when rotational misalignment is present, $\Delta x$ or $\Delta y$ is a function of the exact location of the measurement.

Overlay error measurement is normally done with specially designed targets (or marks) placed at pre-selected locations on the wafer. These targets are typically several tens of microns large and fit within the scribe or kerf area between rows and columns of die. Traditionally overlay targets consisted of box-in-box or bar-in-bar structures. However, recently, grating-based overlay metrology techniques have emerged which require targets periodic in nature. These gratings can be one-dimensional (i.e. rows of lines) or two-dimensional, for example, rows or columns of squares, rectangles, triangles, parallelograms, circles, trapezoids or any other shape that is lithographically printable. U.S. Pat. No. 6,985,618 describes a wide variety of overlay targets. Typically, a grating is placed on the previous layer and another grating on the current layer that is being processed. Normally a grating placed on a previous layer is fully processed (i.e. etched or filled, etc.) and the grating on the current layer is in a photo-resist layer. An overlay metrology tool measures a deviation in placement of a grating in a photo-resist layer with respect to a grating in the processed layer. "Overlay error" is defined as the deviation from ideal, rotational and translational, of the layer being processed to a layer previously processed.

In an overlay metrology tool described in U.S. Pat. No. 6,023,338, issued to Bareket, the system requires mechanical scanning of a focused spot on the gratings. In U.S. Pat. No. 6,710,876, issued to Nikoonahad et al, optical phase of the first order diffracted beams is used to extract the overlay error. In U.S. Pat. No. 7,009,704 issued to Nikoonahad et al the overlay target is imaged with a CCD using a mid numerical aperture (NA) lens and the shift between the adjacent gratings are computed by software. Mechanical systems suffer from wear and tear, friction, instability and drift over time leading to unreliable overlay error measurement. With reference to the optical phase techniques as described in U.S. Pat. No. 6,710,876, the information content in the first diffracted orders is insufficient and it does not adequately address the overlay measurement needs. Also, measuring the optical phase from first order diffraction alone suffers from complications in separating large phase shift arising from the height of the resist layer and the periodic phase shifts embedded in the phase of the reflection coefficient of the previously processed layer. The use of linear mechanical translation of a Wallaston prism or the use of an acousto-optic deflector has been proposed but these add to the complexity of the system. The overlay error control necessary for sub-100 nm integrated circuit devices is less than about five percent of the minimum feature size with a $3\sigma$ precision of less than one percent. This resolution is certainly below the imaging capability of any optical imaging system and, as a result, current imaging systems, as described in 7,009,704, resort to a significant amount of algorithmic post processing to attain meaningful overlay information. None of the techniques described above are fully satisfactory. Clearly additional sensitivity to "overlay-only" errors is of great value. It is, therefore, desirable to develop a system with better performance and a simpler characteristic.

BRIEF SUMMARY OF THE INVENTION

In the present invention, overlay targets, or alignment targets, on two adjacent layers of an integrated circuit, are illuminated by coherent radiation. In some embodiments, a Fourier transform lens optically computes a Fourier transform of the diffraction pattern created by the periodic targets. Analysis of the spatial frequencies at the Fourier plane yields overlay alignment information. For example, without any limitations, from the shifting theorem of the Fourier transforms, any overlay deviation or error translates into a phase term in the field amplitude in the Fourier transform plan and hence a sinusoidal variation in intensity versus alignment of the targets on the two layers.

BRIEF DESCRIPTION OF THE SEVERAL VIEWS OF THE DRAWINGS

FIG. 1 shows a typical grating-based overlay target, by way of an example and without any limitation, and defines the elevation and azimuthal angles.

FIG. 2 shows the illumination spot covering the overlay target and more importantly a multitude of elements from a top grating and a multitude of elements from a lower grating FIG. 3 shows that illumination may be from a single direction.

FIG. 4 shows that illumination may cover a range of elevation angles.

FIG. 5 shows illumination may also be at multiple azimuthal angles.

FIG. 6 shows a typical illuminator.

FIG. 7 shows a two-wavelength illuminator wherein a mirror and beam splitter combine two laser wavelengths into a co-linear beam that is expanded and illuminates overlay target.

FIG. 8 shows an illumination optics wherein two laser lines are coupled to a single illuminator by means of a fiber coupler and two segments of optical fiber.

FIG. 9 shows another embodiment for illumination optics where a single laser feeds two segments of optical fiber through a fiber coupler and an overlay target is illuminated at two azimuthal angles.

FIG. 10 shows a system block diagram. Illumination optics is not shown here for clarity. An illuminated spot is shown covering a multitude of grating elements as shown.

FIG. 11 is a flow chart for an exemplary algorithm.

FIG. 12 shows another embodiment; following a Fourier plan filter, another lens is used to inverse Fourier transform radiation and produce an image of gratings on a CCD FIGS. 13 A and B each show the diffraction pattern from one of two illumination beams offset azimuthally with respect to each other by 180 degrees.

FIG. 14 shows a three-dimensional surface of the intensity (from a one-dimensional grating) in the Fourier transform plane as a function of spatial frequency and overlay error.

DETAILED DESCRIPTION OF THE INVENTION

Figure 13A:
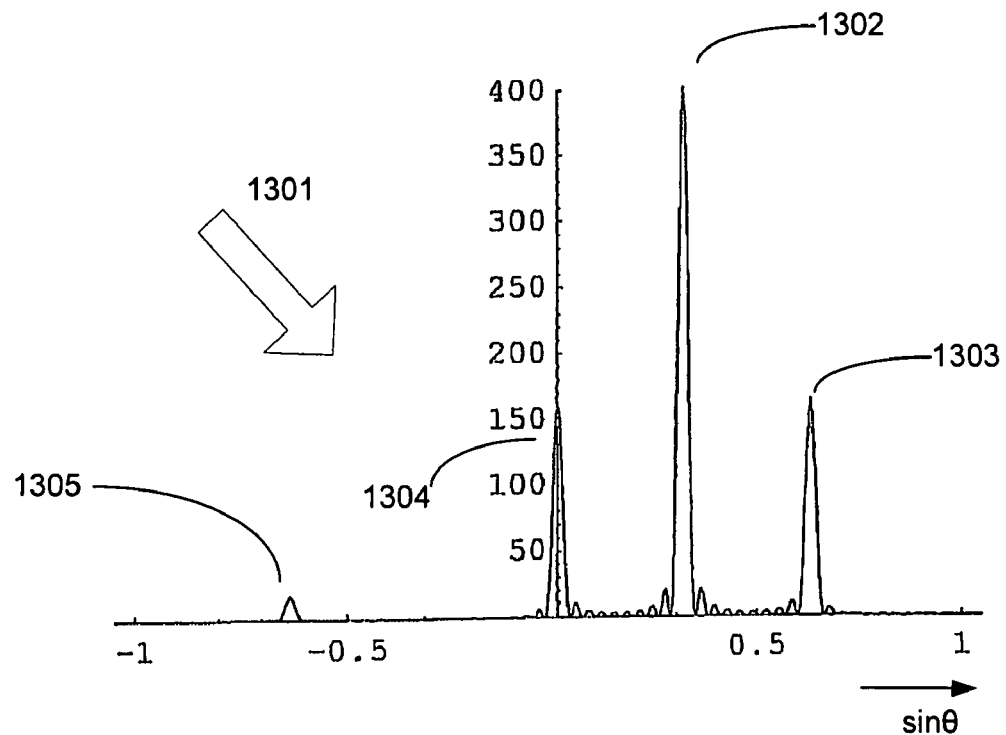

FIG. 1 shows a typical grating-based overlay target by way of an example and without any limitation for some embodiments. This image is not to scale and it is important to point out that while the lateral dimensions of the target may be several tens of microns across, a preferred height of resist grating 110 is only a few hundred nanometers or less. The instant invention applies to most periodic, or grating-based, overlay targets. For example, without any limitations, all structures presented in U.S. Pat. No. 6,985,618 and additional periodic structures can serve as overlay targets for this invention. The important issue to note is that there are two gratings; one formed in the previous layer 120, which is essentially fully processed, and one in the current layer, 110, which in most embodiments, is photo-resist; the instant invention is not limited to photo-resist as a requirement. As alignment shifts from perfect alignment, and no error, to some misalignment and some overlay error, between two gratings, the x direction ($\Delta x$) 130 shift and in the y direction ($\Delta y$) 140 shift are quantities of interest to measure. FIG. 1 also defines elevation 150 and azimuthal 160 angles, which have a role in the context of illumination and collection directions. Note that in all cases, the term "overlay target" comprises an upper periodic grating 110 in a layer being processed and a lower periodic grating 120 in an adjacent, lower layer already processed.

An apparatus or system of the present invention employs one or more illuminators that illuminate a target grating using at least one wavelength of coherent radiation such as from a laser. For the purposes of this description, an illuminator is defined to be a single head for delivery of light; illumination optics refers to an entire sub-system for illumination. As such, illumination optics may encompass one or more illuminators and lasers. In some embodiments, a laser wavelength, without any limitation, may be 920 nm, 890 nm, 670 nm, 633 nm, 532 nm, 488 nm, 405 nm, 364 nm, 266 nm, 257 nm, or 193 nm or any other wavelength available from gas or solid-state lasers or other convenient sources. Multiple wavelengths may also be used. An illumination optics comprises an ensemble of optical components which may include, without limitation, optical fiber, fiber couplers, lenses, lens systems, annular lenses, bright-field microscope objectives, dark-field microscope objectives, reflective microscope objectives, optical filters, diffraction gratings, polarizers, wave-plates, windows, pinholes, beam-splitters, optical-mechanical holders and fixtures, mirrors, dichroic mirrors and beam-splitters, optical modulators, telescopes, beam-expanders, collimators, spatial light modulators and spatial filters. An illumination optics comprises means for conditioning an optical beam, or beams, and means for delivering a beam or multiple beams to a surface of an overlay target. In addition, optionally, means for rotating a polarizer or a wave-plate may be part of the illumination optics. In an example, an illumination optics illuminates an uniform or Gaussian illumination spot of about 1 to 100 microns in diameter to an overlay target. More specifically, an illumination spot diameter may be between about 5 to 50 microns. It is important that an illumination spot 210 cover the overlay targets of the two layers of interest and more importantly a multitude of elements from a top grating, or first target, 220 and a multitude of elements from a bottom grating, or second target, 230 as shown in FIG. 2. A spot 210 may be, without limitations, circular, square or elliptical or other convenient shape. Illumination may be from a single direction with nominal spreading in other directions, as dictated by the laws of diffraction, as shown by illumination beam 310 in FIG. 3. A special form of this type of illumination is normal illumination, which is also within the scope of this invention. Illumination may cover a range of elevation angles and directions as shown in FIG. 4 for beams 310, 420 and 430. Multiple elevation angle illumination may be simultaneous or sequential. Illumination may also be at multiple azimuthal angles as shown in FIG. 5 for beams 310, 420 and 540 and similarly, multiple azimuthal angle illumination may be simultaneous or sequential. It is within the scope of this invention to deploy beams with different optical properties from multiple directions. For example, without any limitations, beams with differing phase or polarizations can be deployed from multiple elevation or azimuthal directions. In addition, it is within the scope of this invention to deploy beams with differing properties across a beam cross section. For example, without any limitations, a single beam may be employed in such a way that a portion of the cross section of the beam has one polarization or phase and the balance of the cross section has a different polarization or phase. In particular, it is within the scope of this invention to illuminate the gratings in the overlay target with differing phases or polarizations. Multiple elevation and azimuthal angle illumination may be achieved by the use of a lens or lens system in the illuminator. A focused beam emanating from a lens is a superposition of waves traveling at different azimuthal and elevation directions and therefore a lens can be used to launch multiple beam illumination.

FIG. 6 shows a typical illuminator 601. Beam 610 from light source 620, for instance, a laser, is passed through polarizer 625 to attain a desired state of polarization for the light. This polarization can be rotated or converted to circular polarization by means of a wave plate 630 that follows the polarizer. A combination of two lenses 635, 640 forms a telescope, which expands and directs the beam to a final lens 645 or microscope objective and the beam is thereby focused onto the overlay target at focal spot 660. FIG. 7 shows a two-wavelength illuminator 701 where a mirror 715 and beam splitter 720 combine two laser wavelengths from two lasers 705 and 706 into a co-linear beam that is expanded and illuminates overlay targets. In this configuration, two spots may illuminate sequentially or simultaneously. FIG. 8 shows an illumination optics where two lasers 705 and 706 are coupled to a single illuminator by means of a fiber coupler 810 and two segments of optical fiber 807 and 808. Note, in some embodiments, polarizer 825 and wave-plate 830 are now internal to a beam expander. It is also within the scope of this invention to implement this illumination system using discrete optical elements, comprising lenses, beam splitters, and mirrors instead of fiber segments. Again, in these configurations two wavelengths may illuminate a wafer simultaneously or sequentially. FIG. 9 shows another embodiment for illumination optics 901 where a single light source 905, such as a laser, feeds two segments of optical fiber 907 and 908 through a fiber coupler 910 and an overlay target 970 is illuminated at two azimuthal angles 981 and 982. It is within the scope of this invention to implement this illumination system using a system of lenses, beam splitters, and mirrors instead of fiber segments. In one embodiment, illumination optics 901 shown in FIG. 9, whether it is implemented with fiber or with discrete optical elements, illuminates a wafer with two beams, 990 and 995, 180 degrees offset azimuthally. In this mode of operation, particular advantages are gained by arranging the optics such that the illumination angle is equal to the angular separation between the diffracted orders from the grating. In mathematical form, under these conditions we have $\theta = \sin^{-1}(\lambda/p)$, where $\theta$ is an illumination angle and $\lambda$ and p are wavelength and pitch (or period) of the gratings in the overlay target respectively. This way an interference is induced between various diffraction orders from each beam enabling a very high sensitivity for detection of overlay error. In some embodiments, coupling with fibers is done to a single illuminator. Also, it is understood that by the combination of a set of mirrors, beam splitters, fibers and couplers many different illumination optics configurations can be realized. For example, without any limitations, illumination optics of FIG. 9 can be implemented by using a single dark-field microscope objective or a lens using an annulus for illumination.

FIG. 10 shows a system block diagram, 1001, for one embodiment. Illumination optics is not shown here for clarity. An illuminated spot 1015 is shown and it covers multitude of grating elements 1005 as shown. A Fourier transform lens 1025 is placed at one focal length F from a wafer 1002; this lens collects scattered and diffracted radiation 1020 from overlay targets 1010, upper, and 1011, lower, (collectively called "diffraction pattern"). At the Fourier transform plane 1040 (or back focal plane) which is one focal length behind the lens, a Fourier plane filter 1030 transmits the optical complex Fourier transform of the field distribution of the overlay targets, yielding a two dimensional image of the spatial frequencies of the transmitted diffraction pattern. A variety of lenses can be used for this application; a thin lens (see for example, Introduction to Fourier Optics by J. W. Goodman, McGraw Hill for a discussion of thin lenses) yields a more accurate Fourier transform operation. Additional relay lenses (not shown in FIG. 10) to magnify or de-magnify the Fourier transform plane may be used so that a pertinent section of a Fourier transform plane is imaged onto an image sensor, such as a CCD 1035, effectively. Even though in FIG. 10 a CCD is shown to be above the wafer, it is within the scope of the invention to offset this in xz or yz planes and only image pertinent sections of a Fourier transform plane, in order to maximize sensitivity to overlay error information. In alternative embodiments, at a Fourier plane, a system may incorporate alternative read out mechanisms such as a linear array, photodiodes or other CMOS image sensor to read out an optical Fourier transform and pass it on to a processor 1050 for computing overlay alignment and/or errors 1060 in the x direction ($\Delta x$) and in the y direction ($\Delta y$).

Alternative embodiments may use alternative means for collecting diffraction patterns comprising one or more of lenses or mirrors. An image sensor 1035 may be located at alternative locations depending on the means for collecting the scattered and reflected radiation comprising various diffraction patterns. An image sensor constitutes a means for converting a received diffraction pattern into two or more electrical signals; the image sensor must maintain the relative locations and intensities, or gray scales, of the overall diffraction pattern signal, and thus the individual spatial frequencies received from the upper and lower grating targets, 1010 and 1011. The image sensor pixel size and gray scale sensitivity, e.g. 256 bits, for instance, must be sufficient for the desired resolution in alignment measurement and alignment error. A clear advantage of the instant invention is that a pixel size may be on the order of 1 micron for error resolution on the order of 1 nm. Additionally, an image sensor must be of some sufficient responsiveness to as many different wavelengths as an illumination source is projecting.

A processor, 1050, also constitutes a means for analyzing; in some embodiments a means for analyzing comprises a processor and resident software comprising capability for addition, subtraction, multiplication, division and Boolean operations, comprising AND, OR, NAND, NOR, XOR, and employing algorithms based on various mathematical models such as RCWA, modal, finite element, or finite difference time domain models; various degrees of "analysis" can be performed on diffraction orders and/or spatial frequencies to yield accurate overlay alignment information acceptable for various alignment criteria.

Although the invention does not wish to be bound by a certain mathematical formulation, for the purposes of illustrating this invention, a formulation is presented.

Assume that a periodic function describing a grating within an overlay target is given by $g(x, y)$. The periodicity may be in complex reflection coefficient, intensity reflectivity, or purely in phase. This depends on whether the lines of the gratings comprise resist, metal, dielectric films deposited, or whether a grating is formed by etched lines filled with another material such as metal or whether the grating lines are from a combination of these materials and structures. The Fourier transform-lens results in a two-dimensional Fourier transform in the form:

$$I(f_x, f_y) = |\int_{-\infty}^{+\infty}\int_{-\infty}^{+\infty}[g(x,y)+g(x-\Delta x, y-\Delta y)e^{j\phi_z}]e^{-j2\pi(f_x x + f_y y)}dxdy|^2 \quad (1)$$

Assuming uniform illumination, which may be normal or oblique, the limits of the integrals in Equation (1) will be over the lateral dimensions of the overlay target. $I(f_x,f_y)$ is the intensity of the Fourier transform of the target at the Fourier transform plane. Equation (1) shows that the two functions that are being Fourier transformed are (i) shifted by $\Delta x$ in the x direction by $\Delta y$ in the y direction and (ii) that one function is phase shifted with respect to the other by an amount $\phi_z$ which is due to the height difference of the two gratings as they are on two separate heights in the z (normal to the xy plane) direction. In the following formulation it is assumed that $\phi_z$ is independent of x and y but in practice $\phi_z$ may be a function of x and y. In Equation (1) $f_x$ and $f_y$ are spatial frequencies given by $$f_x \equiv \frac{x_F}{\lambda F} \text{ and} \tag{2a}$$

$$f_y \equiv \frac{y_F}{\lambda F}. \tag{2b}$$

Where $x_F$ and $y_F$ depict x and y coordinates in the Fourier transform plan, $\lambda$ is the wavelength of radiation and F is the focal length of the Fourier transform lens. Using the shifting theorem of Fourier transform, it can be shown that $$I(f_x,f_y) = |G(f_x,f_y) + G(f_x,f_y) e^{-j2\pi \Delta x f_x} e^{-j2\pi \Delta y f_y}|^2 \tag{3}$$

which simplifies to $$I(f_x,f_y) = |G(f_x,f_y)|^2 [1 + \cos 2\pi(\Delta x f_x + \Delta y f_y)] \tag{4}$$

Equation 4 means that overlay errors $\Delta x$ in the x direction and $\Delta y$ in the y direction lead to a sinusoidal variation with period's $\lambda F/\Delta f$ and $\lambda F/\Delta y$ respectively in the Fourier transform plan. In Equations (1) through (4) equal signs have been used and all proportionality constants have been omitted for clarity of communicating the essential elements of the invention. To obtain the absolute value of each of the quantities on the left side of these equations, additional constants may have to be multiplied by what is given on the right hand side.

Both the focal length of a Fourier transform lens and the wavelength act as scaling factors and provide ample opportunity for suitable system design. For the case of multiple wavelength illumination, it is clear from equations (2a) and (2b) that each wavelength maps onto a different spatial frequency periodicity in the Fourier plane providing additional information for extracting overlay errors. For the case of variable elevation and azimuthal angle illumination, each illumination angle translates into an input spatial frequency and this, in turn, will cause an offset in the spatial frequencies collected at the Fourier transform plane and again provide additional information for computing overlay error. In some embodiments, to within first order approximation, it is estimated that illuminating with N spatial frequencies will lead to $\sqrt{N}$ improvement in overlay error measurement resolution.

In one embodiment an image sensor such as a charged couple device (CCD) is placed directly at the Fourier transform plane. This CCD maps out the function $I(f_x,f_y)$ and transmits it to a processor. Once the Fourier transform plane is imaged each pixel of the CCD will correspond to a unique spatial frequency carrying overlay alignment and error information in a unique way. For example, without any limitations, if a 1,000×1,000 pixel CCD is used, 1,000,000 spatial frequencies each of which carries overlay error information in a unique way is available. A variety of mathematical manipulations, comprising addition, subtraction, multiplication, division can be performed on the spatial frequencies in order to accurately extract overlay information. For example, without any limitations, all spatial frequencies can be normalized to the zero order diffraction to remove absolute value of the light intensity. In addition numerous Boolean operations, comprising AND, OR, NAND, NOR, XOR, can be performed on these spatial frequencies to yield accurate overlay alignment information. It is clear that this invention offers significant superiority over the technology disclosed in the U.S. Pat. No. 6,710,876 wherein only spatial frequencies corresponding to the first order diffracted waves, which occur at ±1/p, where p is the period or pitch of the elements of a grating target, are used in overlay error computation. In the instant invention data from at least two orders of diffracted waves is used in the overlay error analysis.

In another embodiment for overlay alignment measurement the computed and measured intensities at the Fourier transform plane are compared. This is done through a two-dimensional surface fitting with a processor between the measured 1130 and computed 1120 $I(f_x,f_y)$ to attain the best Goodness of Fit (GOF) over the entire Fourier transform plane. A flow chart for such algorithm is provided in FIG. 11. The initial values for overlay shift may be set to zero or a number very close to zero. Computations for $I(f_x,f_y)$ can be carried out using, without limitations, Rigorous Coupled Wave Analysis (RCWA), Finite Difference Time Domain (FDTD), modal or integral equation methods. For a case where $\phi_z$ is independent of x and y, $I(f_x,f_y)$ can be computed analytically in most cases from Equation (4). For example, without any limitations, for almost all grating functions of interest $G(f_x,f_y)$ is a sinc function: (where sinc $X=(\sin \pi X)/\pi X$ repeated at every 1/p. If $I(f_x,f_y)$ cannot be computed analytically, it can be computed numerically from Equation (1). Equation (1) can be computed for a range of overlay alignments in x and y and all the values can be stored in a library. The measured $I(f_x,f_y)$ is compared to all library data and matched to a library element that offers the best GOF and hence overlay alignments and errors are determined. The overlay error can also be computed using a nonlinear regression algorithm by floating parameters of Equation (1) or (4).

A system is further provided with a Fourier plane filter 1030 as shown in FIG. 10. The purpose of this filter is to suppress unwanted components of the spatial frequency spectrum or wavelengths (for the case of multiple wavelength illumination) which do not carry any significant information about overlay alignment and errors $\Delta x$ in the x direction by $\Delta y$ in the y direction. Another purpose of this filter is to phase shift individual components of the spatial frequency spectrum. A Fourier plane filter comprises patterns of opaque material deposited on a transparent material such as glass or plastic or other similar material. Since one knows a priori what the overlay grating target is, one knows what the transform looks like in a Fourier transform plane and hence the exact shape of a preferred Fourier filter. In some embodiments, in order to compensate for shades of gray in a Fourier transform plane, the Fourier plane can be a programmable Liquid Crystal Display (LCD).

FIG. 12 provides another embodiment of this invention. Following a Fourier plan filter 1030, another lens 1260 is used to inverse Fourier transform radiation and produce an image of gratings on a CCD 1035 which is accentuated in terms of the overlay errors $\Delta x$ and $\Delta y$ and suppressed in terms of spatial frequency components which do not contain overlay alignment and error information. This facilitates computation of overlay alignment and errors in subsequent processing. For example, without any limitations, a Fourier plane filter with a transmittance in the form $1/G(f_x,f_y)$ eliminates grating lines on an image plane and leads to only a spot shifted in x and in y from the image coordinate. These shifts correspond to x and y overlay alignment shifts and alignment errors.

Figure 13B:
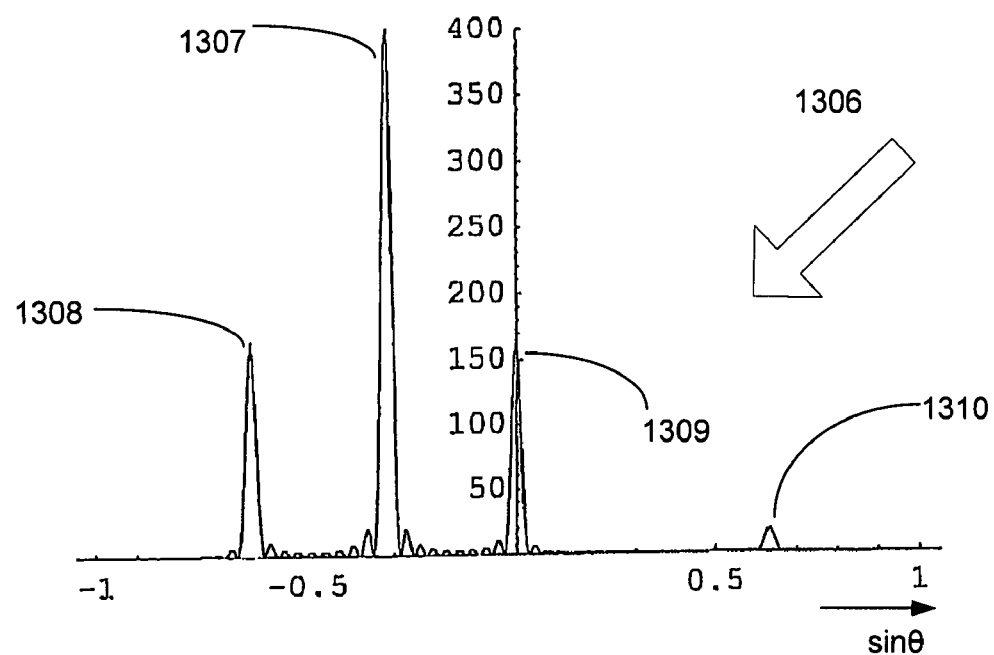

FIGS. 13A and B show the computer simulations of diffraction orders from two illuminating beam offset azimuthally by 180 degrees as a function of the sine of the elevation angle; in practice, in some embodiments, the two beams shown would be present simultaneously; the beams are shown here in two separate figures for clarity. FIG. 13A shows the diffraction orders for a beam 1301 illuminating the target from the left. The specular reflection 1302, the "+1" diffraction order 1303 as well as the "−1" order 1304 and "−3" order 1305 are clearly noted in FIG. 13A. FIG. 13B shows the diffraction orders for an illuminating beam 1306 illuminating the target from the right. The specular reflection 1307, the "+1" diffraction order 1308 as well as the "−1" order 1309 and "−3" order 1310 are clearly visible in FIG. 13B. For clarity the overlay target is not shown in these figures. It is important to point out that since for this simulation the illumination angle is $\sin^{-1}(\lambda/p)$, in both FIGS. 13A & B the location of the "−2" orders are exactly where the illumination beams are; for this reason the "−2" orders have not been shown. As before, $\lambda$ and p are wavelength and pitch (or period) of the gratings in the overlay target respectively. It is also clear that on a detector a number of interference terms are present when two beams are simultaneously illuminating two or more targets on two levels; namely: between "−3" order 1305 from FIG. 13A and "+1" order 1308 from FIG. 13B; between "−1" order 1304 from FIG. 13A and "−1" order 1309 from FIG. 13B; between "+1" order 1303 from FIG. 13A and "−3" order 1310 from FIG. 13B. These interference terms enable the calculation of overlay errors; minimize the effects of vibration and thermal drifts and provide very high sensitivity and resolution to overlay alignment deviation and/or errors.

Figure 15:
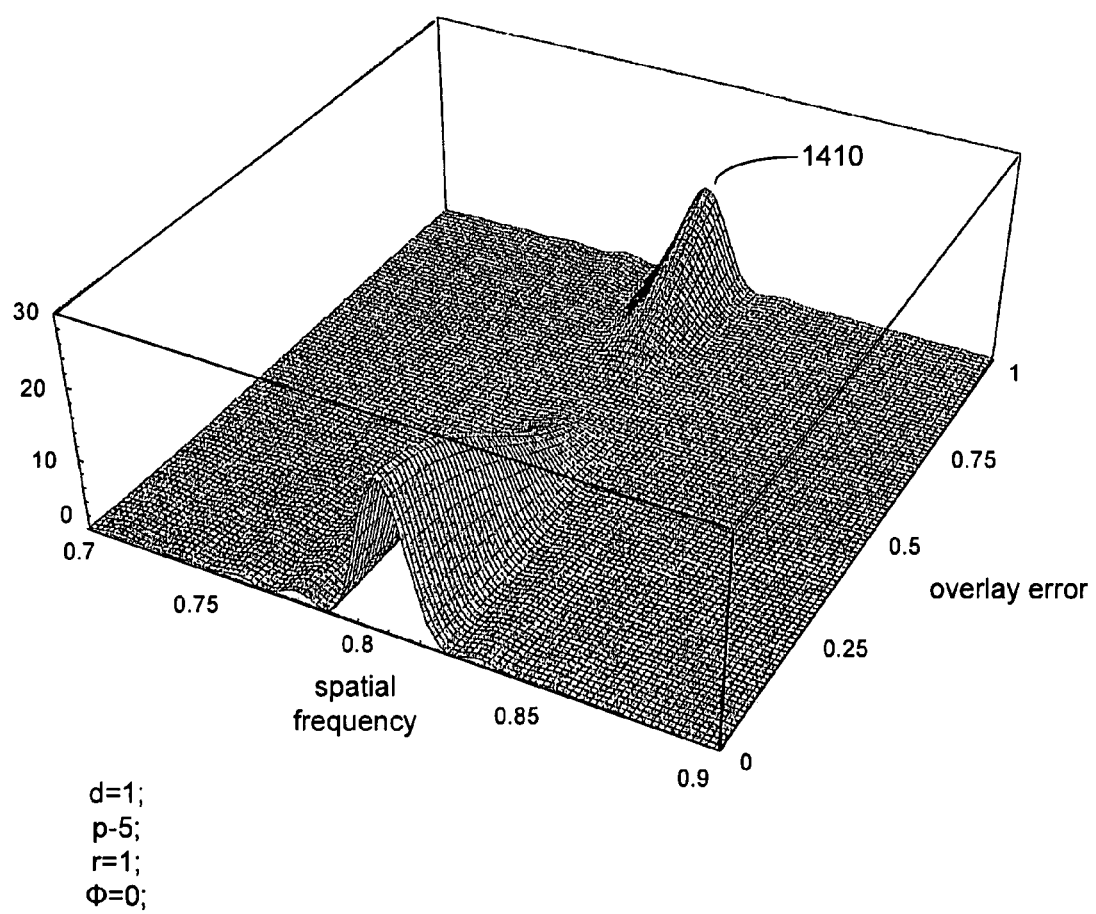
FIG. 15 shows a $4^{th}$ order diffraction on a more sensitive scale.

FIG. 14 shows by way of an example, and without any limitation, a three-dimensional surface 1401 of the intensity (from a one-dimensional grating) in the Fourier transform plane as a function of spatial frequency and overlay alignment and error. It is seen that the $4^{th}$ order diffraction 1410 changes much more rapidly than the zero order or the first order. FIG. 15 shows the $4^{th}$ order diffraction on a more sensitive scale. Note that for a spatial frequency of 0.8 $\mu m^{-1}$ at about an overlay error of 0.25 micron the intensity of the fourth order changes by a factor of almost 20 and between 0.25 and 0.5 micron overlay error the signal goes to zero. Herein, "overlay error" and "alignment tolerance" are used interchangeably. Even though the overlay errors of interest are significantly smaller than 0.25 micron, the example shows that certain parts of the spatial frequency map offer significantly higher sensitivity. For example, and without limitation, in this particular example an overlay offset of 0.25 micron can be designed into the target so that the measurement tool is operating at its most sensitive regime and then any error around the designed offset can be measured with high sensitivity. By analyzing multiple diffraction orders the alignment ambiguity associated with analyzing one order is removed.

In one embodiment an apparatus for overlay measurements, comprises at least two illumination beams substantially illuminating the same area of an overlay target, a means for collecting a diffraction pattern from the target, a means for converting the diffraction pattern to at least two electrical signals, and a means for analyzing the at least two electrical signals; wherein the signals have a spatial, or location, and intensity, or gray scale, relationship to each other based on the combined diffraction pattern transmitted from an overlay target comprising an upper and lower periodic grating. Optionally, at least two illuminating beams originate from at least one laser; optionally, at least two illuminating beams have different elevation angles; optionally, at least two illuminating beams have different azimuthal angles; optionally, at least two illuminating beams are 180 degrees offset azimuthally; optionally, at least two illuminating beams are at least four illuminating beams wherein at least groups of two said illuminating beams are 180 degrees offset azimuthally; optionally, a means for collecting the diffraction pattern comprises a Fourier transform lens; optionally, a means for converting the diffraction pattern to at least one electrical signal is at least one chosen from a group comprising a photodiode array, a CCD, a photomultiplier array, a CMOS image sensor array, a linear array, and an array of avalanche photodiodes; optionally, a means for analyzing at least one electrical signal comprises means for digitizing said at least one electrical signal and means for computation; optionally, a means for analyzing comprises Boolean operations chosen from a group comprising at least one of AND, OR, NAND, NOR or XOR; optionally, a means for analyzing comprises the step of constructing a mathematical model of the diffraction pattern from the overlay target and the step of comparing the measured diffraction pattern to the mathematical model; optionally, the apparatus further comprises at least one spatial filter wherein the at least one spatial filter preferentially suppresses parts of said diffraction pattern before means for converting converts said diffraction pattern to at least one electrical signal.

In an embodiment an apparatus for making overlay alignment and error measurements, comprises at least two illumination beams of coherent radiation substantially illuminating the same area of an overlay target wherein the overlay target comprises at least two periodic arrays, one in an upper layer and one in an adjacent lower layer, a means for collecting a diffraction pattern from the targets, a means for converting the diffraction pattern to at least two electrical signals, and a means for analyzing the at least two electrical signals; wherein the signals have a spatial and intensity, or gray scale, relationship to each other based on the combined diffraction pattern transmitted from an upper and lower periodic grating. Optionally, at least two illuminating beams originate from at least one laser; optionally, at least two illuminating beams have different elevation angles; optionally, at least two illuminating beams have different azimuthal angles; optionally, each beam of said at least two illuminating beams has independent polarization control; optionally, at least two illuminating beams are 180 degrees offset azimuthally and the elevation angle of the two beams substantially equals the diffraction angle of the gratings: $\theta=\sin^{-1}(\lambda/p)$, where $\theta$ is an illumination angle in the elevation direction and $\lambda$ and p are wavelength and pitch (or period) of the gratings in the overlay target respectively; optionally, at least two illuminating beams are at least four illuminating beams wherein at least groups of two said illuminating beams are 180 degrees offset azimuthally; optionally, a means for collecting the diffraction pattern comprises a Fourier transform lens; optionally, a means for converting the diffraction pattern to at least one electrical signal is one from a group comprising a photodiode array, a CCD, a photomultiplier array, a CMOS image sensor array, a linear array, and an array of avalanche photodiodes; optionally, a means for analyzing at least one electrical signal comprises means for digitizing said at least one electrical signal and means for computation; optionally, a means for analyzing further comprises Boolean operations chosen from a group comprising at least one of AND, OR, NAND, NOR or XOR; optionally, the apparatus further comprises at least one spatial filter wherein the at least one spatial filter preferentially suppresses parts of said diffraction pattern before means for converting converts said diffraction pattern to at least one electrical signal; optionally, a means for analyzing comprises the step of constructing a mathematical model of the diffraction pattern from the overlay target and the step of comparing the measured diffraction pattern to the mathematical model wherein the mathematical model comprises at least one of RCWA, modal, finite element, or finite difference time domain models; optionally, the two illumination beams are formed from at least one of a group comprising a beam splitter, a diffraction grating and a fiber coupler; optionally, one beam of said two illumination beams is phase shifted with respect to the other beam of said two illumination beams by a pre-determined amount. The repeat distance, or period, or pitch, of a periodic grating divided by the width of an individual feature is termed the line space ratio; optionally a line space ratio of gratings may range from more than 10:1 to less than 2:1. Optionally, a pitch of a grating may range from about 0.1 to about 10 microns; different pitches may be used for applications requiring special considerations. In some embodiments the pitch to width ratio of the at least two periodic arrays is more than 1.05 to 1.

In general a grating size must be greater than $\lambda/2$ or one-half the wavelength used to illuminate the grating targets. In some embodiments a "means for collecting" is a Fourier transform lens.

The measurement systems described here in can either be the measurement engine for a stand-alone tool used in integrated circuit processing or they can serve as the measurement engine of an integrated tool. An integrated tool is one in which the tool is designed and built with a relatively smaller footprint and is integrated into a larger process tool such as lithography stepper.

Foregoing described embodiments of the invention are provided as illustrations and descriptions. They are not intended to limit the invention to precise form described. In particular, it is contemplated that functional implementation of invention described herein may be implemented equivalently. Alternative construction techniques and processes are apparent to one knowledgeable with integrated circuit processing, optics and alignment measurement technologies. Other variations and embodiments are possible in light of above teachings, and it is thus intended that the scope of invention not be limited by this Detailed Description, but rather by Claims following.

I claim:

1. An apparatus for overlay alignment measurements, comprising:
    at least two illumination beams substantially illuminating the same area of an overlay target;
    means for collecting a diffraction pattern from the overlay target;
    means for converting the diffraction pattern to at least two electrical signals; and
    means for analyzing the at least two electrical signals; wherein the at least two signals are analyzed for relative location and intensity and an overlay alignment measurement is calculated.

2. The apparatus of claim 1 wherein said at least two illuminating beams originate from at least one laser.

3. The apparatus of claim 1 wherein said at least two illuminating beams have different elevation angles.

4. The apparatus of claim 1 wherein said at least two illuminating beams have different azimuthal angles.

5. The apparatus of claim 4 wherein said at least two illuminating beams are azimuthally offset by 180 degrees.

6. The apparatus of claim 4 wherein said at least two illuminating beams are at least four illuminating beams wherein at least two groups of two said illuminating beams are azimuthally offset by 180 degrees.

7. The apparatus of claim 1 wherein said means for collecting the diffraction pattern comprises a Fourier transform lens.

8. The apparatus of claim 1 wherein said means for converting the diffraction pattern to at least two electrical signals is one from a group comprising a photodiode array, a CCD, a photomultiplier array, a CMOS image sensor array, a linear array, and an array of avalanche photodiodes.

9. The apparatus of claim 1 wherein said means for analyzing at least two electrical signals comprises means for digitizing said at least two electrical signals and means for computation.

10. The apparatus of claim 1 wherein said means for analyzing comprises Boolean operations chosen from a group comprising at least one of AND, OR, NAND, NOR or XOR.

11. The apparatus of claim 1 wherein said means for analyzing comprises the step of constructing a mathematical model of the diffraction pattern from the overlay target and the step of comparing the measured diffraction pattern to the mathematical model.

12. The apparatus of claim 8 wherein the apparatus further comprises at least one spatial filter wherein the at least one spatial filter preferentially suppresses parts of said diffraction pattern before means for converting converts said diffraction pattern to at least one electrical signal.

13. An apparatus for making overlay measurements, comprising:
    at least two illumination beams of coherent radiation substantially illuminating the same area of an overlay target wherein the overlay target comprises at least two periodic arrays;
    means for collecting the diffraction pattern from the target;
    means for converting the diffraction pattern to at least two electrical signals; and
    means for analyzing the at least two electrical signals; wherein the at least two signals are analyzed for relative location and intensity for overlay alignment measurement.

14. The apparatus of claim 13 wherein said at least two illuminating beams originate from at least one laser.

15. The apparatus of claim 13 wherein said at least two illuminating beams have different elevation angles.

16. The apparatus of claim 13 wherein said at least two illuminating beams have different azimuthal angles.

17. The apparatus of claim 13 wherein each beam of said at least two illuminating beams has independent polarization control.

18. The apparatus of claim 13 wherein said at least two illuminating beams are azimuthally offset by 180 degrees.

19. The apparatus of claim 18 wherein said at least two illuminating beams are azimuthally offset by 180 degrees and the elevation angle of the two beams is chosen to substantially equal the diffraction angle of the at least two periodic arrays.

20. The apparatus of claim 19 wherein said at least two illuminating beams are at least four illuminating beams wherein at least groups of two said illuminating beams are azimuthally offset by 180 degrees.

21. The apparatus of claim 13 wherein said means for collecting the diffraction pattern comprises a Fourier transform lens.

22. The apparatus of claim 13 wherein said means for converting the diffraction pattern to at least two electrical signals is one from a group comprising a photodiode array, a CCD, a photomultiplier array, a CMOS image sensor array, a linear array, and an array of avalanche photodiodes.

23. The apparatus of claim 13 wherein said means for analyzing at least two electrical signals comprises means for digitizing said at least two electrical signals and means for computation.

24. The apparatus of claim 23 wherein said means for analyzing further comprises Boolean operations chosen from a group comprising at least one of AND, OR, NAND, NOR or XOR.

25. The apparatus of claim 13 wherein the apparatus further comprises at least one spatial filter wherein the at least one spatial filter preferentially suppresses parts of said diffraction pattern before means for converting converts said diffraction pattern to at least one electrical signal.

26. The apparatus of claim 13 wherein said means for analyzing comprises the step of constructing a mathematical model of the diffraction pattern from the overlay target and the step of comparing the measured diffraction pattern to the mathematical model wherein the mathematical model comprises at least one of RCWA, modal, finite element, or finite difference time domain models.

27. The apparatus of claim 13 wherein said two illumination beams are formed from at least one of a group comprising a beam splitter, a diffraction grating and a fiber coupler.

28. The apparatus of claim 13 wherein one beam of said two illumination beams is phase shifted with respect to the other beam of said two illumination beams by a pre-determined amount.

29. Apparatus of claim 13 wherein the pitch to width ratio of the at least two periodic arrays is more than 1.05 to 1.

30. Apparatus of claim 13 wherein the pitch of the at least two periodic arrays is in a range of about 0.1 to 10 microns.

31. A method for measuring overlay error in an integrated circuit comprising the steps:
 choosing at least a first and second periodic grating overlay target wherein the pitch of the at least a first and second periodic grating overlay target is in a range of about 0.1 to 10 microns;
 illuminating at least a first overlay target and a second overlay target with coherent radiation of at least one frequency with illumination optics;
 collecting diffracted radiation from at least a first and second overlay targets through a Fourier transform lens;
 obtaining the optical Fourier transform of the field distribution of at least a first and second overlay targets;
 imaging at least a portion of the transformed radiation onto an image sensor; and
 analyzing location and intensity data from the image sensor; such that at least two orders of diffracted radiation data are analyzed.

32. The method of claim 31 wherein said analyzing comprises Boolean operations chosen from a group comprising at least one of AND, OR, NAND, NOR or XOR.

33. The method of claim 31 wherein said analyzing comprises constructing a mathematical model of the diffraction pattern from the overlay target and comparing the measured diffraction pattern to the mathematical model wherein the mathematical model comprises at least one of RCWA, modal, finite element, or finite difference time domain models.

* * * * *